(12) United States Patent
Lai et al.

(10) Patent No.: US 6,448,126 B1
(45) Date of Patent: Sep. 10, 2002

(54) METHOD OF FORMING AN EMBEDDED MEMORY

(75) Inventors: Erh-Kun Lai, Tai-Chung Hsien; Hsin-Huei Chen, Miao-Li Hsien; Shou-Wei Huang, Chi-Lung; Ying-Tso Chen, Kao-Hsiung Hsien; Chien-Hung Liu, Taipei; Shyi-Shuh Pan, Kao-Hsiung, all of (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/682,217

(22) Filed: Aug. 7, 2001

(51) Int. Cl.⁷ .......................................... H01L 21/8238
(52) U.S. Cl. ...................... 438/216; 438/257; 438/264; 438/591
(58) Field of Search ................................. 438/216, 257, 438/264, 591, 594; 257/315, 316, 324, 326; 365/185.3, 185.33; 711/102; 710/8

(56) References Cited

U.S. PATENT DOCUMENTS 5,622,881 A * 4/1997 Acocella et al. .......... 365/185.1
5,966,603 A * 10/1999 Eitan ........................... 438/258
6,346,442 B1 * 2/2002 Aloni et al. ................. 438/216

OTHER PUBLICATIONS

Shum, Embedded Non Volatile Memories, 2001, IEEE, 0–7803–6677–8/01, pp. 210–215.*

* cited by examiner

Primary Examiner—Carl Whitehead, Jr.
Assistant Examiner—Jeff Vockrodt
(74) Attorney, Agent, or Firm—Winston Hsu

(57) ABSTRACT

A method of forming an embedded memory integrating nitride read only memory starts by forming an ONO layer and a protective cap layer on a surface of a semiconductor substrate defined with a memory area and a periphery area. The periphery area has a first, a second and a third device area. An etching and a first ion implantation process form each bit line in the memory area. A spacer is then formed at either side of the protective cap layer and the ONO layer in the memory area, and the protective cap layer and the ONO layer are removed in the first device area. The threshold voltage for the first device area is adjusted and a first thermal oxidation process forms a buried drain oxide layer atop each bit line and a first gate oxide layer on the surface of the first device area, respectively. The protective cap layer and the ONO layer are removed from the second device area and the third device area, and a second gate oxide layer is formed in the second device area and the third device area. Finally, the protective cap layer in the memory area and the second gate oxide layer in the third device area are removed, and a third gate oxide layer is formed in the third device area.

11 Claims, 14 Drawing Sheets

METHOD OF FORMING AN EMBEDDED MEMORY

BACKGROUND OF INVENTION

1. Field of the Invention

The present invention provides a method of forming an embedded memory, and more particularly, to a method of integrating nitride read only memory (NROM).

2. Description of the Prior Art

In the modern electronics industry, read only memory and a corresponding control device often need to exist in various products simultaneously. In contrast to manufacturing two devices on a single chip, manufacturing the two devices on two separate chips occupies more room and also lifts a production cost. Read only memory (ROM) devices are semiconductor devices for data storage. ROM is composed of a plurality of memory cells and is applied in data storage and memory systems of computers widely today. Read only memory can be classified into mask ROM, programmable ROM (PROM), erasable programmable ROM (EPROM), electrically erasable programmable ROM (EEPROM), nitride read only memory (NROM) and flash ROM, according to a method used for data storage. Once data or information is stored in ROM, the data will not disappear if there is an interruption of power, therefore read only memory is also called non-volatile memory.

Nitride read only memory (NROM) utilizes a silicon nitride isolation dielectric layer as a charge trapping medium. Since the silicon nitride layer is highly dense, hot electrons can tunnel into the silicon nitride layer and be trapped inside it through a MOS transistor. This further forms an inhomogeneous density distribution in order to accelerate a rate of data reading and to avoid leakage current. Because the flash ROM utilizes a floating gate composed of polysilicon or metal to store charges, the flash ROM has an extra gate in addition to a control gate. The former has an advantage of using a simple manufacturing process and incurring a low cost. As the latter one needs to be made with a floating gate-inter-dielectric layer-control gate structure, and the quality of the material in the three-layer structure is very important, it is necessary to coordinate with suitable processes, and this results in a more complex manufacturing process and a higher cost.

Therefore, in U.S. Pat. No. 5,403,764, Yamamoto et al. proposes a method of implanting ROM code into the flash ROM device in the ROM region by utilizing an ion implantation process during a flash ROM manufacturing process, in other words, completing the "read" procedure, then completing the manufacturing process of flash ROM as normal. So, the read only memory can be established in some portion of the flash ROM chip.

Please refer to FIG. 1 to FIG. 5. FIG. 1 to FIG. 5 are schematic diagrams of a process for making a flash ROM chip 10 comprising read only memory 24, according to the prior art. As shown in FIG. 1, the prior art method of forming a flash ROM chip 10 comprising read only memory 24 is to provide a semiconductor wafer 11 comprising a P-type silicon base 12, then utilize a thermal oxidation process with temperature about 1100° C. and process time about 90 minutes to form a plurality of silicon dioxide ($SiO_2$) layers 14 with a thickness of several thousands of angstroms(Å) on a region of the surface of the silicon base 12 not covered by an oxidation-protective film(not shown), such as silicon nitride($Si_3N_4$). After that, the remaining silicon nitride layer (not shown) is removed and a very thin silicon oxide layer 16 is preserved between the silicon dioxide layers 14, that is, between each field oxide (FOX) layer. In other words, local oxidation (LOCOS) is utilized to form the isolation in between each transistor, which is completed afterwards.

As shown in FIG. 2, an ion implantation process is then performed in the read only memory area 18 of the flash ROM chip 10. The ion implantation process utilizes an accelerating energy ranging from 40 to 50 keV, and a Boron ion dosage ranging from 1E12 to $3E12/cm^2$ to form a first P+ type doping area 22 having ion concentration ranging from $10^{16}$ to $10^{17}/cm^3$. The objective of the ion implantation process is to adjust a threshold voltage (Vth) of the first read only memory (not shown) in the read only memory area 18 to a first specific value, so the threshold voltage of the first read only memory (not shown) is adjusted to around 1 V and stores a data "1".

As shown in FIG. 3, a first photolithography process is then performed in order to form a first mask 31 out of the read only memory area 18 and the read only memory (not shown), with a second specific value as its threshold voltage, in the read only memory area 18. Thereafter, an ion implantation process is performed on the flash ROM chip 10. The ion implantation process utilizes an accelerating energy ranging from 40 to 50 keV, and a Boron ion dosage ranging from 5E12 to $1E13/cm^2$ to form a second P+ type dopant area 32 having a final ion concentration ranging from $10^{17}$ to $10^{18}/cm^3$. The objective of the ion implantation process is to adjust the threshold voltage (Vth) of the second read only memory (not shown) in the read only memory area 18 to a second specific value, so the threshold voltage of the second read only memory (not shown) is adjusted to around 7V and stores a data "0".

As shown in FIG. 4, a first polysilicon layer 34, an interlayer isolation layer 36 composed of silicon nitride or silicon oxide and a second polysilicon layer 38 are then deposited on the flash ROM chip 10. After that, a second photolithography process is performed in order to form double gates 39 of the first read only memory 24, the second read only memory 26 and the flash ROM 40. Although the gate structures of the first read only memory and the second read only memory 24, 26 are single layered in a general case and the double gates 39 having three layered structure are not required, all of the gates are completed with the same process steps in the prior art method in order to reduce process steps.

As shown in FIG. 5, a phosphorous ion implantation process utilizing a third mask (not shown) is performed in order to form an N+ source 41 and an N+ drain 42 at either side of the double gate 39 of the first read only memory and the second read only memory 24, 26 to complete the manufacturing of the first read only memory and the second read only memory 24, 26. Finally, another phosphorous ion implantation process utilizing a fourth mask (not shown) is performed in order to form an N+ source 43 and an N+ drain 44 at either side of the double gate 39 of the flash ROM 40 to complete the manufacturing of the flash ROM 40. Therefore, not only the read only memories 24, 26 on the flash ROM chip 10 are written with "0" or "1," but the flash ROM 40 is also completed by just adding two process steps for threshold voltage adjustment in the standard flash ROM manufacturing process.

Moreover in U.S. Pat. No. 5,966,603, Eitan proposes a method of forming a single chip simultaneously comprising nitride read only memory and a periphery transistor, and points out that the periphery device can have gate dielectric layers with two different thicknesses. He only describes process steps for making the gate dielectric layers with two different thickness briefly. He does not propose a method of protecting the ONO (bottom oxide-nitride-top oxide) dielectric layer in the memory structure in the etching or cleaning process to avoid a top oxide loss problem when making the gate dielectric layers with two different thicknesses.

The prior art methods of making a flash ROM chip up to this point do not disclose any effective methods for resolving the top oxide loss problem. Moreover, the flash ROM is not suitable for being manufactured as a system on chip or an embedded memory, because its cost is high. Therefore, it is very important to develop a method of forming an embedded memory that utilizes cheaper devices together with the flash ROM manufacturing process.

SUMMARY OF INVENTION

It is therefore a primary objective of the present invention to provide a method of forming an embedded memory, and more particularly, to a method of integrating nitride read only memory (NROM).

In a first preferred embodiment of the present invention, the method of forming the embedded memory integrating nitride read only memory (NROM) comprises providing a semiconductor substrate defined with a memory area and a periphery area. At least a first, a second, and a third device area are defined in the periphery area. Then, a plurality of isolators is formed on the surface of the semiconductor substrate for isolating devices. An ONO layer and a protective cap layer are formed on the surface of the semiconductor substrate. A patterned first photoresist layer and a first photolithography process are used to define sites of a plurality of bit lines. Regions of the cap layer and the ONO layer not covered by the first photoresist layer are removed by utilizing a first etching process. A first ion implantation process is performed to form each bit line in the semiconductor substrate in the memory area. Thereafter, the first photoresist layer is removed. A spacer is formed at either side of the cap layer and the ONO layer in the memory area. Then, a second etching process is performed to remove the cap layer and the ONO layer in the first device area. The threshold voltage for the first device area is adjusted by performing a second ion implantation process. A first thermal oxidation process forms a buried drain oxide layer atop each bit line and a first gate oxide layer in the first device area. A third etching process removes the cap layer and the ONO layer in the second device area and the third device area. Then, a second thermal oxidation process forms a second gate oxide layer in the second device area and in the third device area. The cap layer in the memory area is removed. A fourth etching process is performed to remove the second gate oxide layer in the third device area. A third thermal oxidation process forms a third gate oxide layer in the third device area.

It is an advantage of the present invention that the method utilizes a cap protective layer and a spacer to protect the ONO dielectric layer in the memory device. Though the wafer needs to be treated with repeated cleaning and etching processes to form various periphery devices, the memory structure is still kept integrated. Therefore, problems of electrical performance being out of spec and broad distribution infeasibility can be avoided, and the reliability of the memory device is improved. Furthermore, the present invention forms gate oxide layers with various thicknesses in the periphery area. The gate oxide layers not only can be applied on various periphery transistors, but can also be applied on different non-volatile memory structures. This increases the possibility of embedding various devices, and enlarges the application range of a single chip. Also, the cost for nitride read only memory is cheaper than the cost of flash ROM memory, and the process for the nitride read only memory is simpler.

These and other objectives of the present invention will no doubt become obvious to those of ordinary skill in the art after having read the following detailed description of the preferred embodiment that is illustrated in the various figures and drawings.

DETAILED DESCRIPTION

Figure 1:
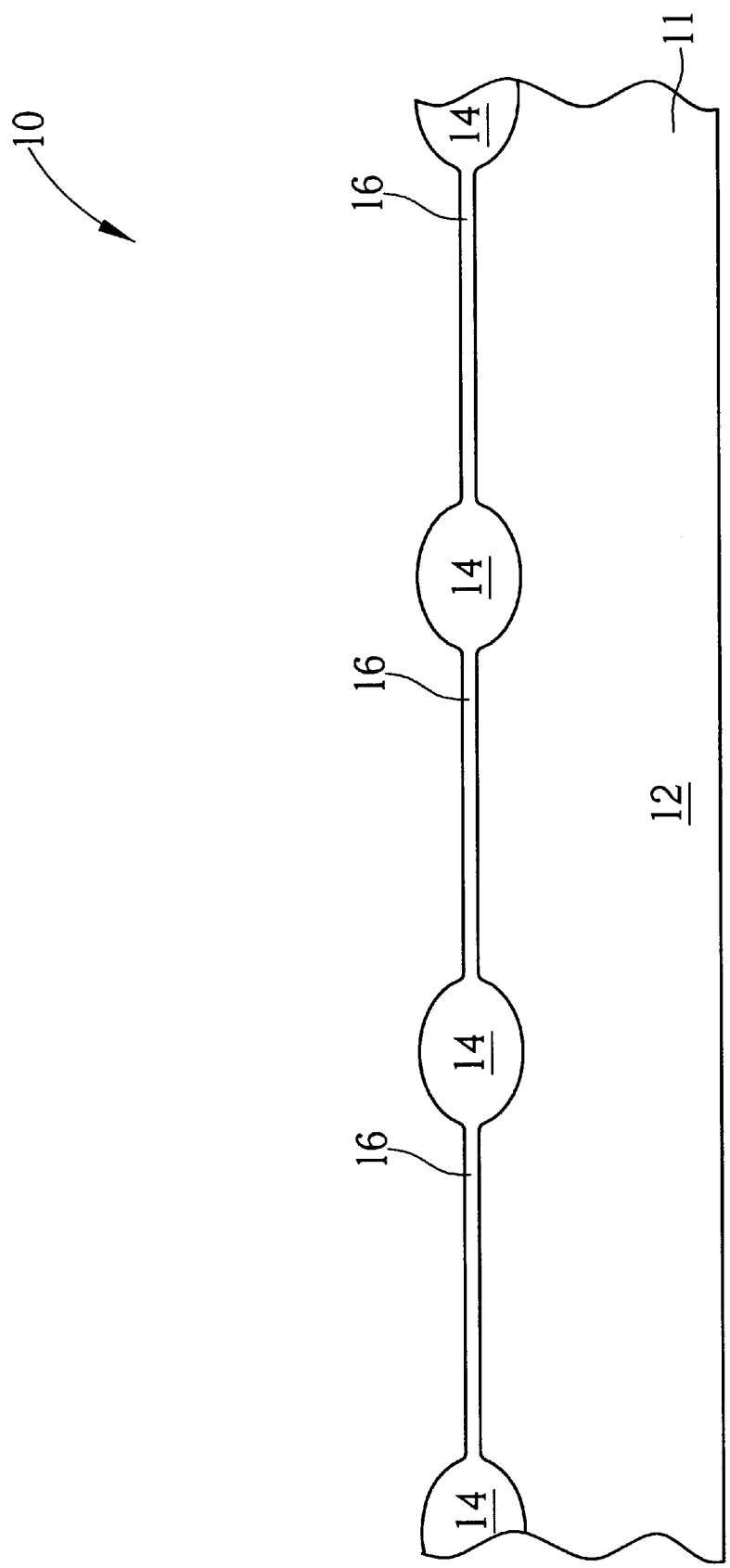
FIG. 1 to FIG. 5 are schematic diagrams of a process for making a flash ROM chip comprising read only memory, according to the prior art.
Figure 2:
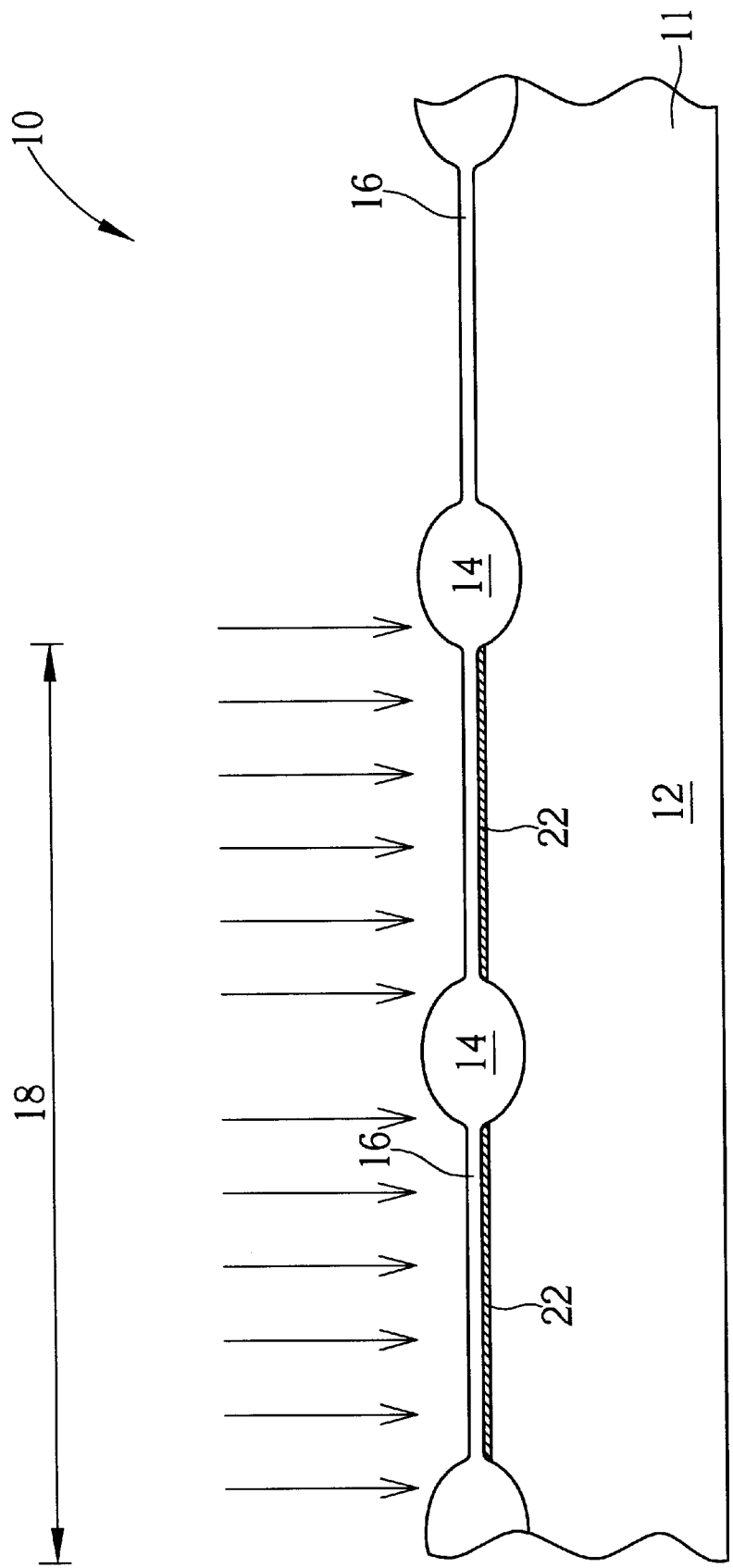
Figure 3:
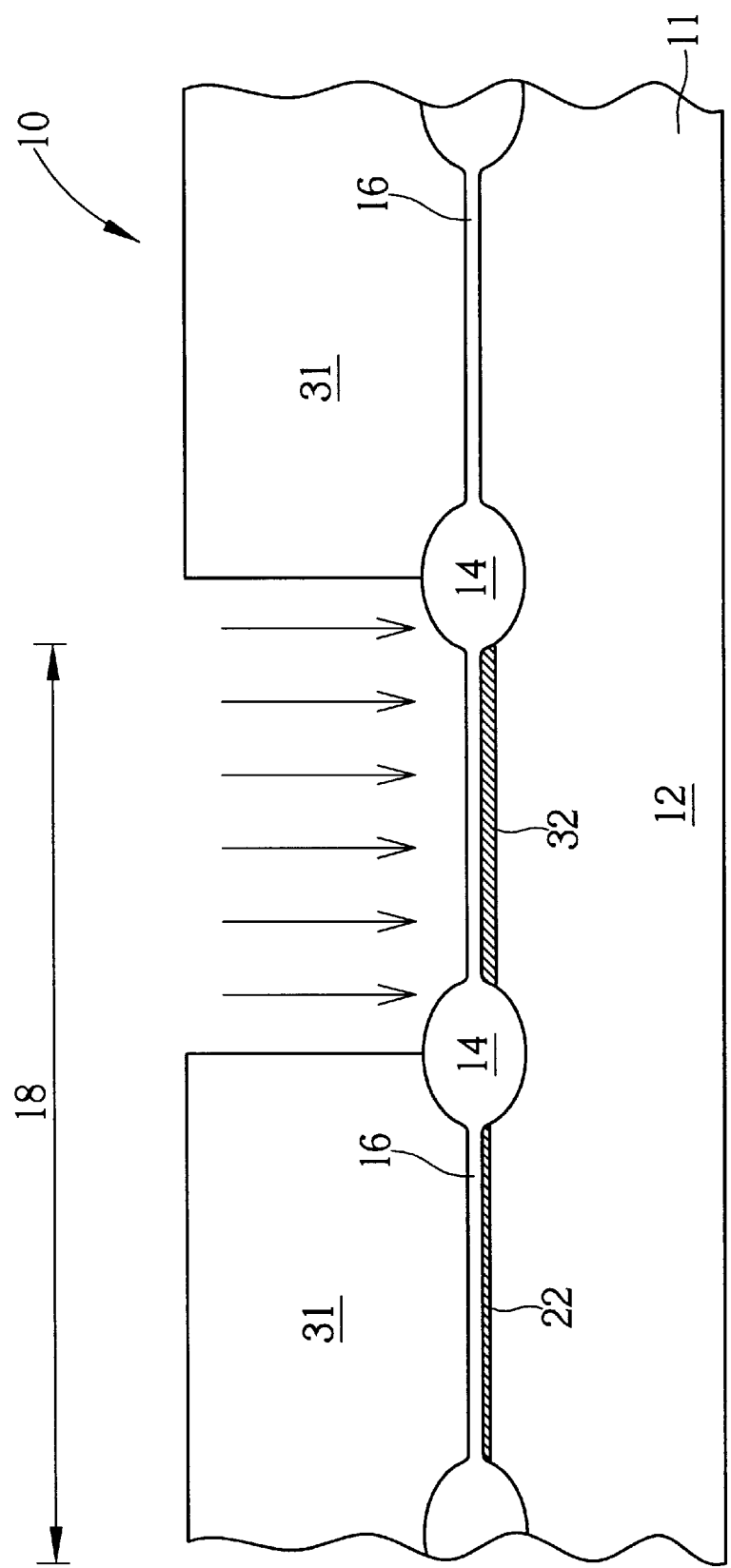
Figure 4:
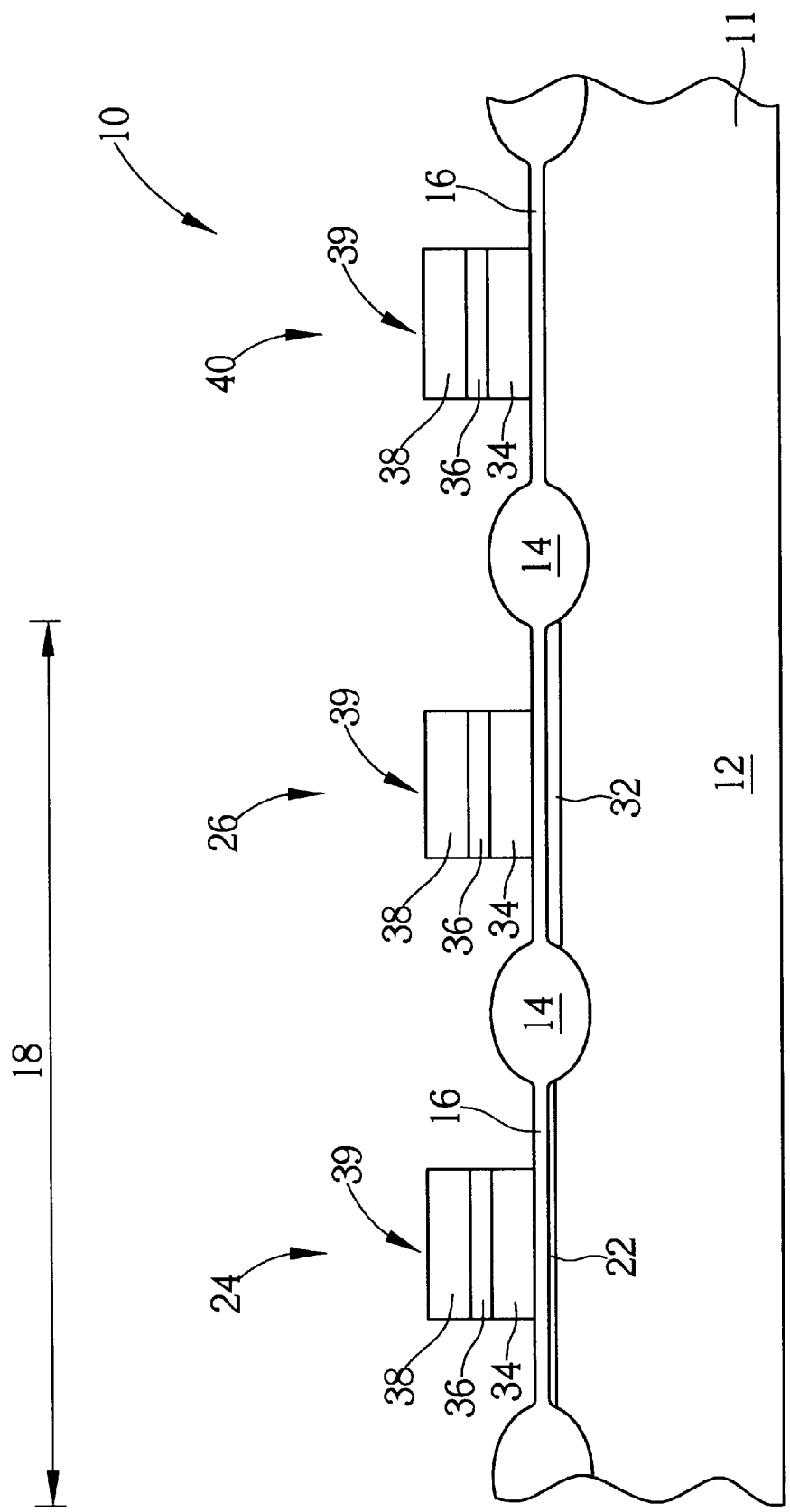
Figure 5:
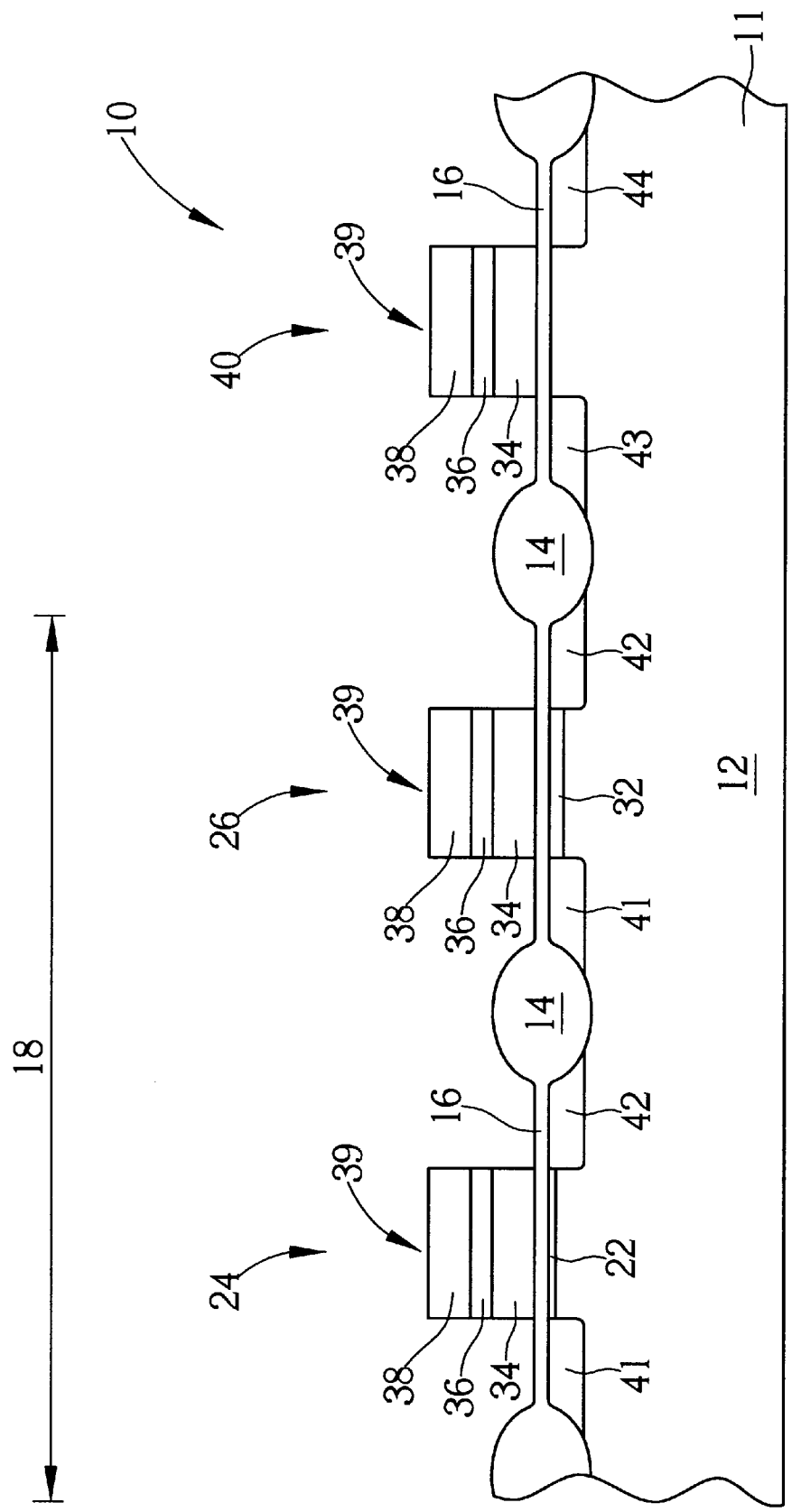
Figure 6:
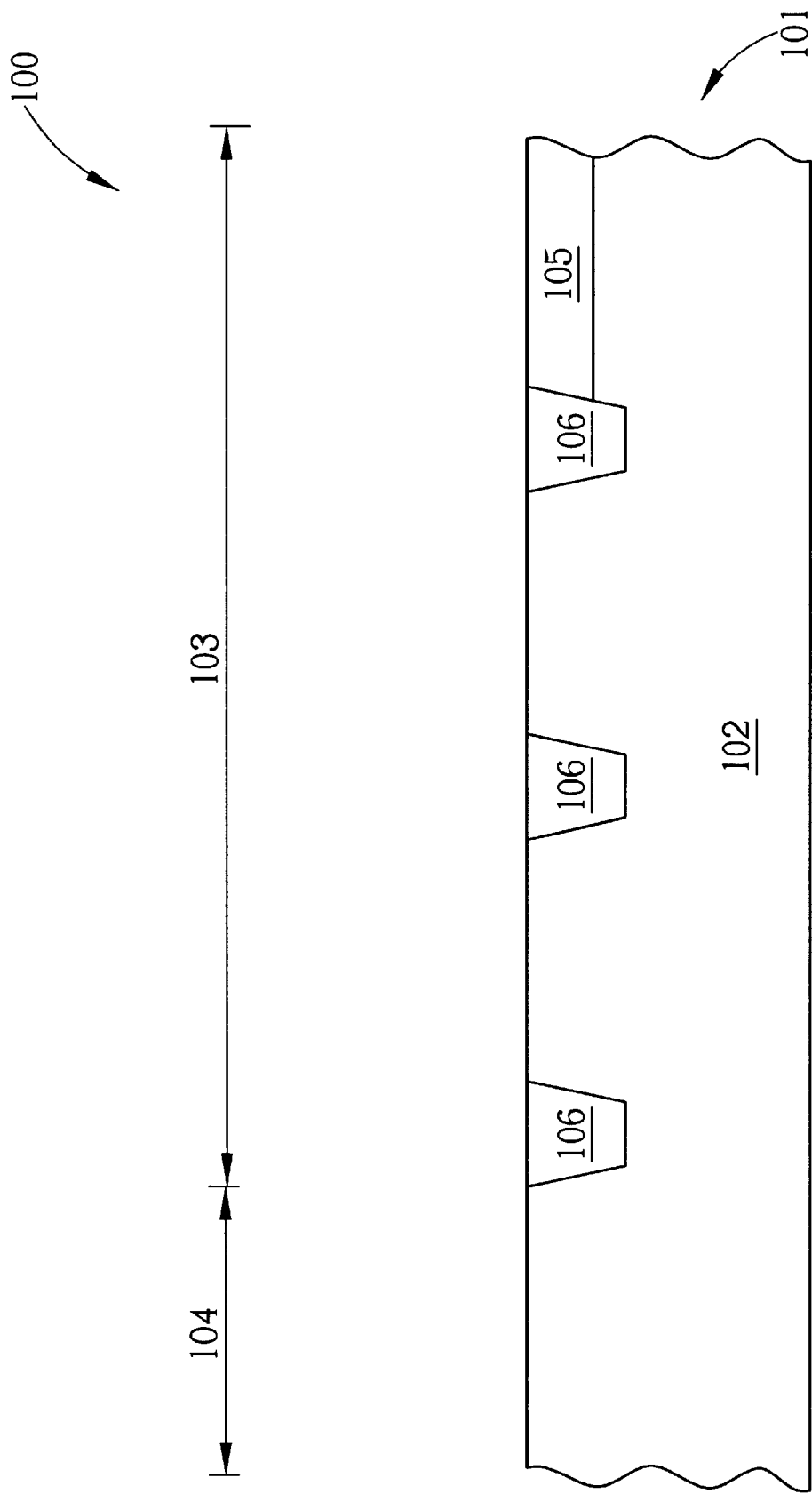
FIG. 6 to FIG. 14 are schematic diagrams of a process for forming an embedded memory integrating nitride read only memory, according to the present invention.

Please refer to FIG. 6 to FIG. 14. FIG. 6 to FIG. 14 are schematic diagrams of a process for forming an embedded memory chip 100 integrating nitride read only memory (NROM),according to the present invention. As shown in FIG. 6, the present invention method of forming the embedded memory chip 100 starts with providing a semiconductor wafer 101, defined with a periphery area 103 and a memory area 104. The semiconductor wafer 101 comprises a P-type silicon substrate 102, and the P-type substrate 102 further comprises a first device area (not shown), a second device area(not shown), and a third device area(not shown) defined in the periphery area 103.

An N-type ion implantation process and a P-type ion implantation process are performed sequentially to form an N-well (not shown) and a P-well (not shown) for a high voltage transistor device (not shown) in the periphery area 103. For the convenience of illustration, only a well 105 and a transistor are presented in the present invention. A plurality of isolators is formed on the surface of the substrate 102 in order to isolate the periphery area 103 and the memory area 104, respectively, and define an active area of each device. The isolators can be shallow trench isolation areas or field oxide layers. In the figures, a shallow trench isolation area 106 is used for illustration. Finally, all of the pad oxide layers (not shown) are removed.

Figure 7:
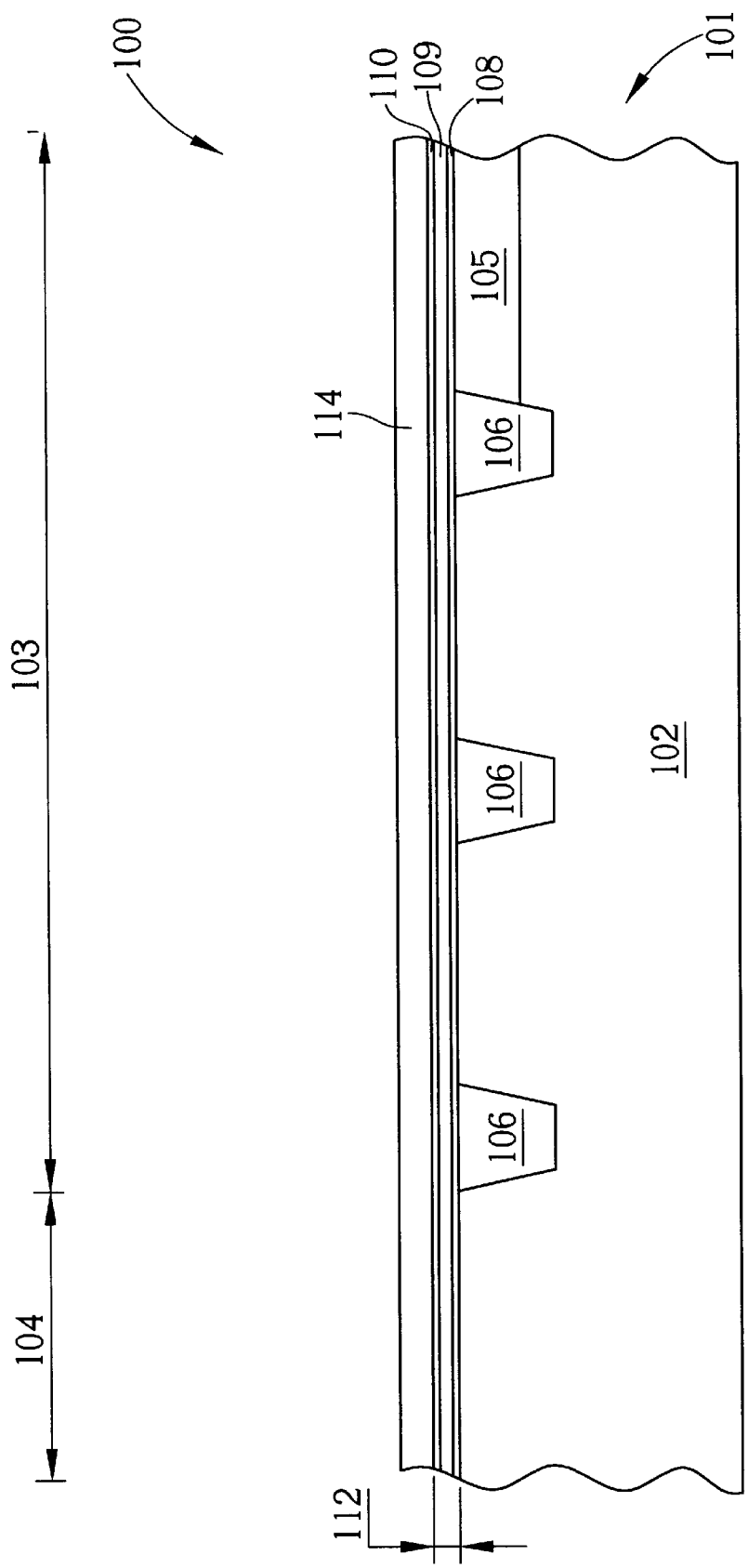

As shown in FIG. 7, a low temperature oxidation process with temperature ranging from 750° C.~1000° C. then forms an oxide layer, with a thickness ranging from 50~150 angstroms(Å), on the surface of the silicon substrate 102 for use as a bottom oxide layer 108. A low pressure vapor deposition (LPCVD) process is performed to deposit a silicon nitride layer 109, with a thickness ranging from 100 to 300 angstroms, atop the bottom oxide layer 108 for use as a charge trapping layer. Finally, an annealing process at 950° C. for 30 minutes to recover the structure of the silicon nitride layer 109, and a wet oxidation process is performed by inputting water vapor to form a silicon oxy-nitride layer, with a thickness of 50~200 angstroms, atop the silicon nitride layer 109, for use as a top oxide layer 110. During the growth process of the top oxide layer 110, approximately 25~100 angstroms of silicon nitride layer 109 are consumed. The bottom oxide layer 108, the silicon nitride layer 109 and the top oxide layer 110 formed atop the silicon base 102 are together called an ONO dielectric layer 112. A low pressure vapor deposition (LPCVD) process is performed to form a silicon nitride layer, with a thickness of approximately 400 angstroms, atop the top oxide layer 110 for use as a protective cap layer 114. Moreover, the previously mentioned ion implantation process for adjusting the threshold voltage (Vt) can be performed at this point to avoid destruction of the lattice structure of the P-type silicon substrate 102.

Figure 8:
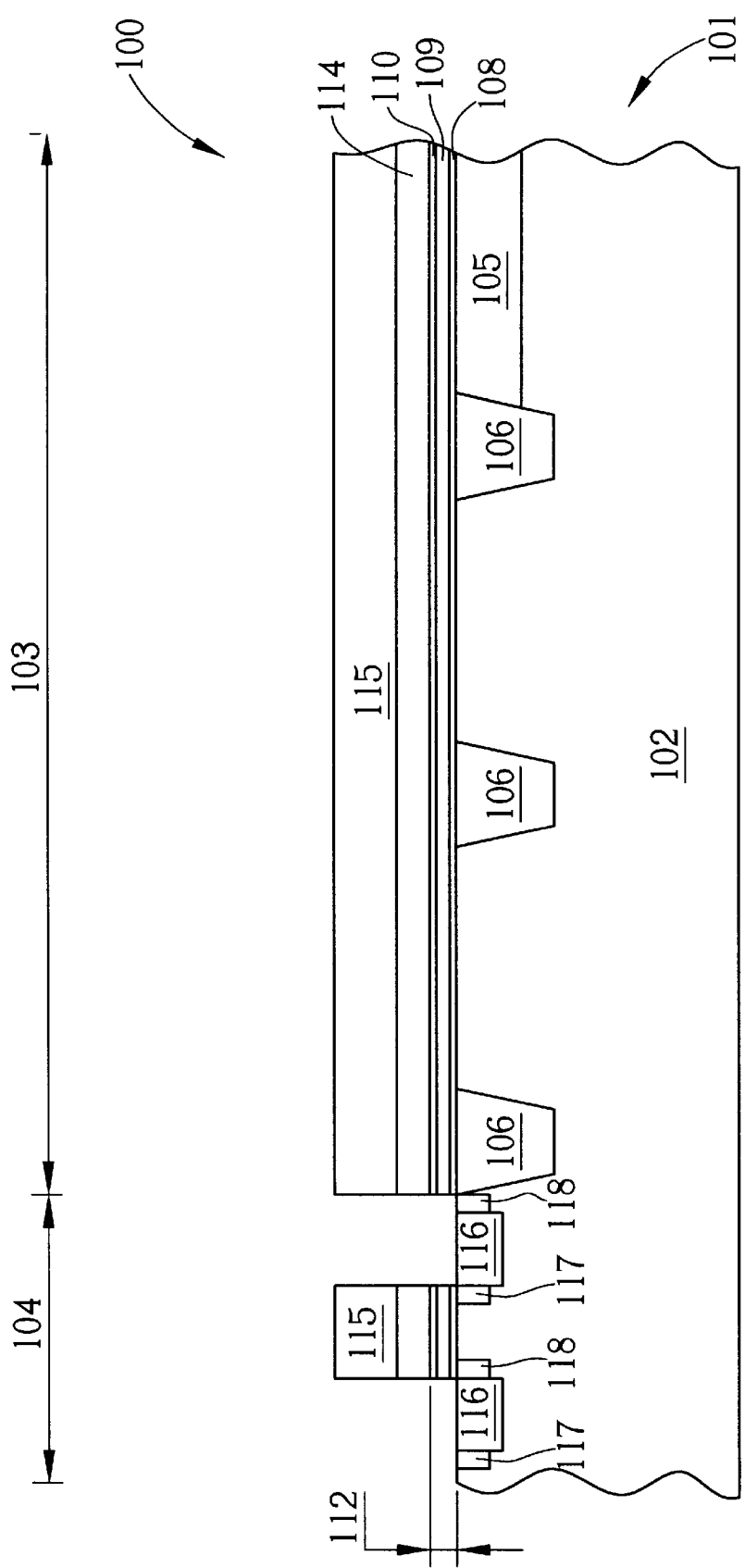

Then, as shown in FIG. 8, a first photoresist layer 115 is formed atop the ONO dielectric layer 112, and a first photolithography and etching process are performed to form a predefined pattern in the first photoresist layer 115 for defining sites of bit lines. Thereafter, a dry etching process is performed to remove the regions of the protective cap layer 114, the top oxide layer 110, the silicon nitride layer 109, and regions of the bottom oxide layer 108 not covered by the first photoresist layer 115. In other words, all of the ONO dielectric layer 112 is removed. Optionally, regions of the protective cap layer 114, the top oxide layer 110, and the silicon nitride layer 109 not covered by the first photoresist layer 115 can be removed, and regions of the bottom oxide layer 108 not covered by the first photoresist layer 115 can be etched to a predetermined thickness by utilizing the first photoresist layer 115 as a mask. After that, an ion implantation process with an arsenic dosage ranging from 2~4 E15/cm$^2$ and an energy approximately 50 keV is performed in order to form a plurality of N+ doping areas in the silicon substrate 102 for use as bit lines 116 of memory cells. The bit lines 116 are also called buried drains. Each two neighboring doping areas define a channel and the distance between the two neighboring doping areas is channel length.

An angled ion implantation process is performed in order to form a P$^-$ type pocket doping area 117 at one side of each bit line 116. Another angled ion implantation process is performed in order to form a P$^-$ type pocket doping area 118 at another side of each bit line 116. These two angled ion implantation processes have approximately the same parameters, except for incident directions.

The two angled ion implantation processes utilize BF$^{2+}$ as dopant, having a dosage of approximately 1E13 to 1E15 ions/cm$^2$, an implantation energy of 20 to 150 KeV, and an incident angle to the silicon substrate 102 of approximately 20 to 45°. These two angled ion implantation process can be performed prior to the ion implantation process for forming the bit lines 116. Under this process condition, a region of the silicon substrate 102 having the highest concentration of implanted BF$^{2+}$ dopants is located underneath the channel at a depth of approximately 1000 angstroms, and the horizontal distance implanted underneath the channel ranges from several hundreds to 1000 angstroms, approximately. The object of forming P$^-$ type pocket doping areas 117,118 is to provide a high electric field area at one side of the channel. The high electric field area enhances a hot carriers effect, improve electron velocity when passing through the channel during programming. In other words, the electrons are accelerated in order to make more electrons acquire enough dynamic energy by way of collision or scattering effects to tunnel through the bottom oxide layer 108 and penetrate into the silicon nitride layer 109, which further lifts writing efficiency.

Figure 9:
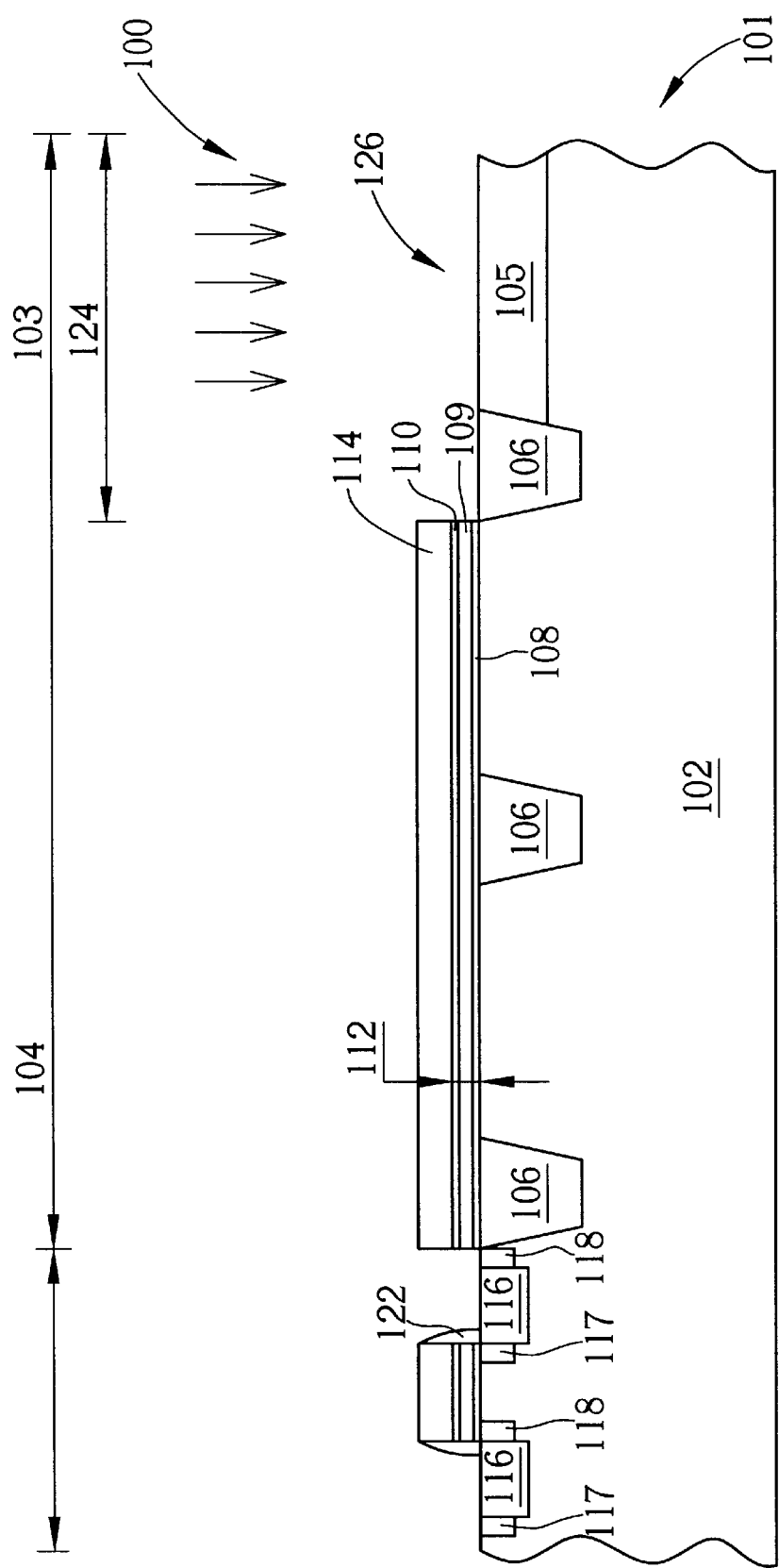

As shown in FIG. 9, the first photoresist layer 115 is removed. Then, a spacer 122 is formed at either side of the protective cap layer 114 and the ONO layer 112 in the memory area 104. A second dry etching process is performed to remove the ONO dielectric layer 112 in the first device area 124 in the periphery area 103 by utilizing a photoresist layer (not shown) as a mask. Thereafter, a first ion implantation process is performed on the active area 126 of the high voltage periphery transistor (not shown) in the first device area 124 to adjust threshold voltage. The previously mentioned N-type ion implantation process and P-type ion implantation process for forming the N-well (not shown) and the P-well (not shown) of the high voltage transistor device (not shown) in the periphery area can be performed prior to the first ion implantation process.

Figure 10:
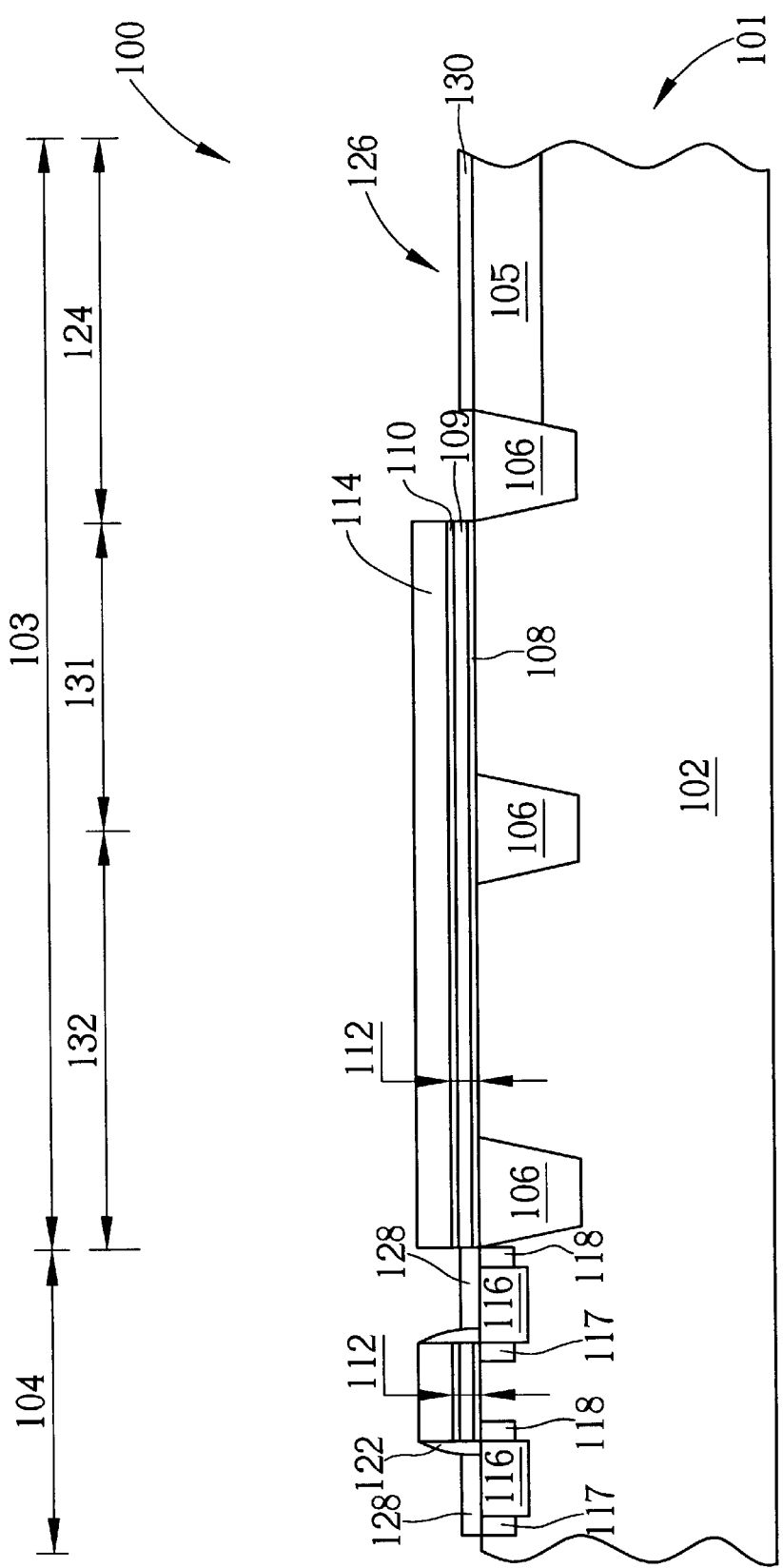

As shown in FIG. 10, the photoresist layer (not shown) is removed, then a first cleaning process is performed. A thermal oxidation process is performed to form a buried drain oxide layer 128 atop each bit line 116, and to activate the dopants in each bit line 116 by using the thermal energy from the high temperature of the buried drain oxidation process. Furthermore, the thermal oxidation process simultaneously forms a first gate oxide layer 130 on the surface of the active area 126 in regions of the periphery area 103 of the semiconductor wafer 101 not covered by the ONO dielectric layer 112. The first gate oxide layer does not grow on regions of the memory area 104 and the periphery area 103 having the ONO dielectric layers 112.

Figure 11:
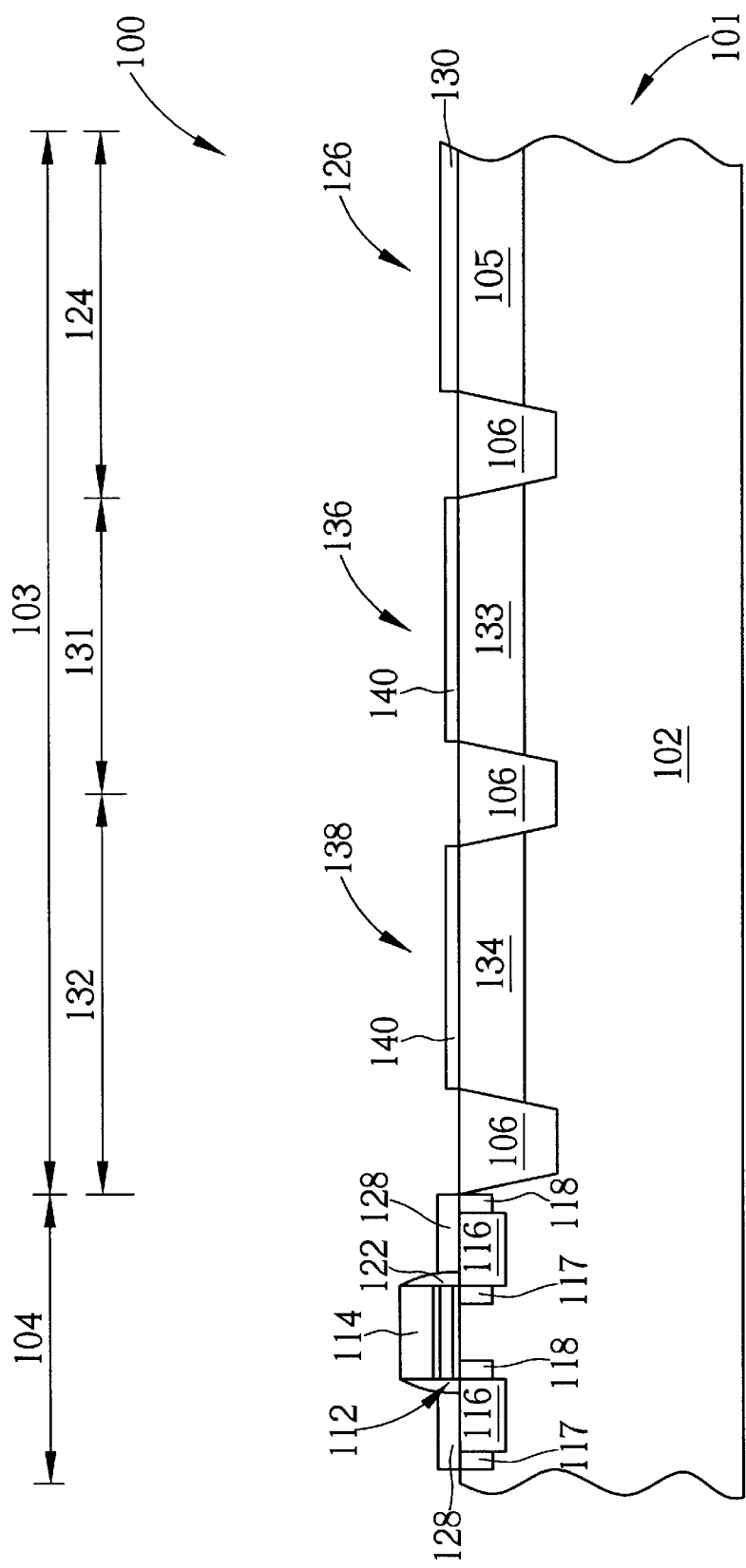

As shown in FIG. 11, a third dry etching process is then performed to remove the protective cap layer 114 and the ONO dielectric layer 112 in a portion of the second device area 131 and a portion of the third device area 132 in the periphery area 103 by utilizing a photoresist layer (not shown) as a mask. An N-well ion implantation process forms the N-well (not shown) for the second periphery transistor (not shown) and the third periphery transistor (not shown), respectively. After removing this photoresist layer (not shown), a fourth dry etching process removes the protective cap layer 114 and the ONO dielectric layer 112 in a portion of the second device area 131 and a portion of the third device area 132 in the periphery area 103 by utilizing a photoresist layer (not shown) as mask. A P-well ion implantation process forms the P-wells (not shown) for the second periphery transistor (not shown) and the third periphery transistor (not shown), respectively. Finally remove the photoresist layer(not shown). For convenience of illustration, only two wells 133,134 and two transistors are shown, for representation, in the present invention. Of course, after the ion implantation process for the N-well (not shown) and the P-well (not shown), different ion implantation processes are usually added to adjust the threshold voltage of the second periphery transistor (not shown) and the third periphery transistor (not shown).

A second cleaning process is performed on the embedded memory chip 100. A second gate oxide layer 140 is formed on the surfaces of the active areas 136, 138 of the second periphery transistor (not shown) and the third periphery transistor (not shown) in the periphery area 103 of the semiconductor wafer 101 by utilizing a thermal oxidation process, respectively. At this process step, the thickness of the buried drain oxide layer 128 atop the bit line 116 in the memory area 103 and the thickness of the first gate oxide layer 130 in the memory area 104 in the semiconductor wafer 101 both increase. Since the doped bit line 116 is underneath the buried drain oxide layer 128, the growth rate of the buried drain oxide layer 128 is higher than the growth rate of the first gate oxide layer.

Figure 12:
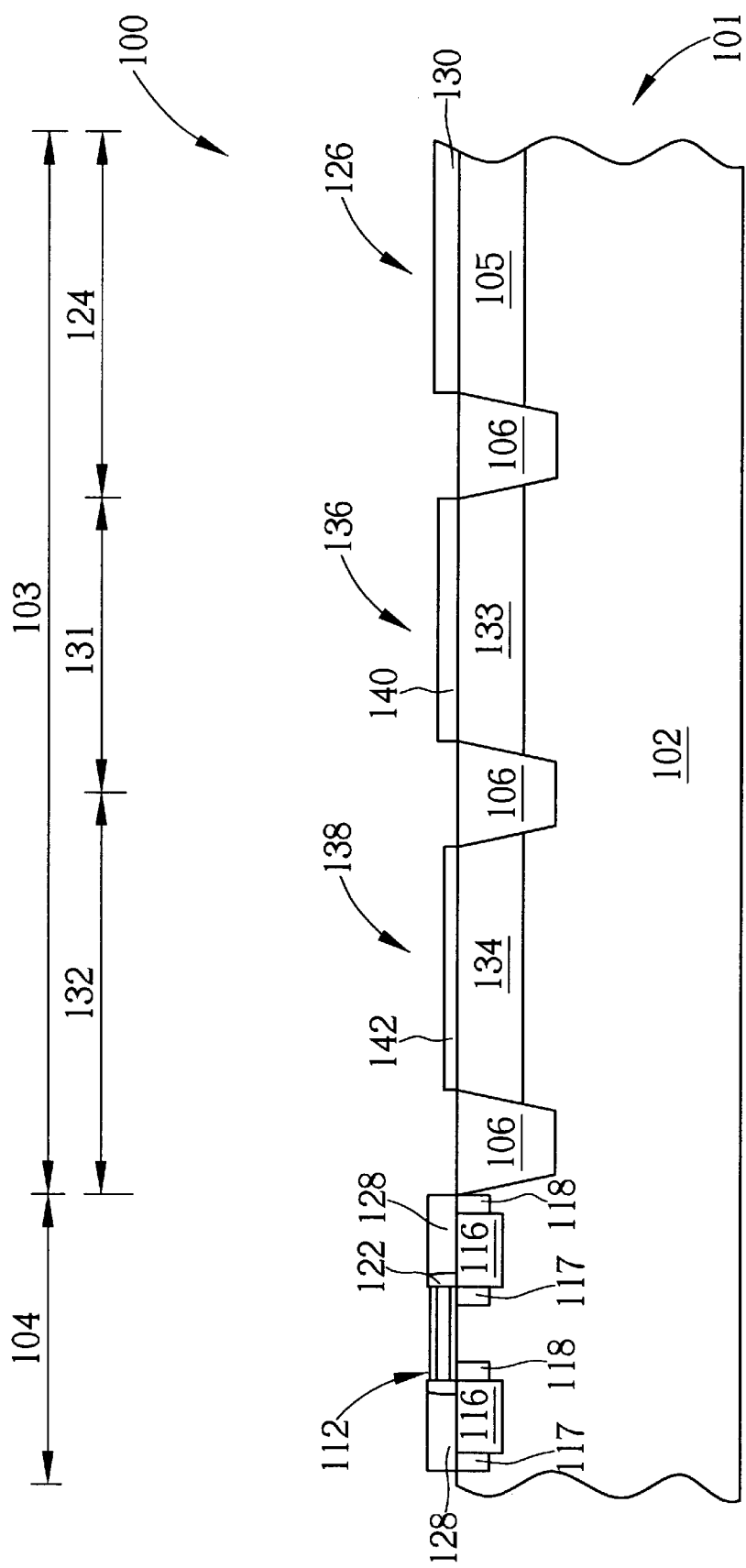

As shown in FIG. 12, the protective cap layer 114 in the memory area 104 is removed. By utilizing a photoresist layer (not shown) and an etching process, the second oxide layer 140 in the third device area 132 in the periphery area 103 is removed. After removing the photoresist layer (not shown), a third cleaning process is performed. Then, a thermal oxidation process is performed to form a third gate oxide layer 142 on the surface of the active area 138 in the periphery area 103 of the semiconductor wafer 101. At this process step, the thickness of the buried drain oxide layer 128 atop the bit line 116 in the memory area 103 and the thickness of the first and the second gate oxide layers 130, 140 in the memory area 104 of the semiconductor wafer 101 all increase. After the repeated cleaning and etching processes, the thickness of the first gate oxide layer 130 is larger than the thickness of the second gate oxide layer 140, and the thickness of the second gate oxide layer 140 is larger than the thickness of the third gate oxide layer 142.

Figure 13:
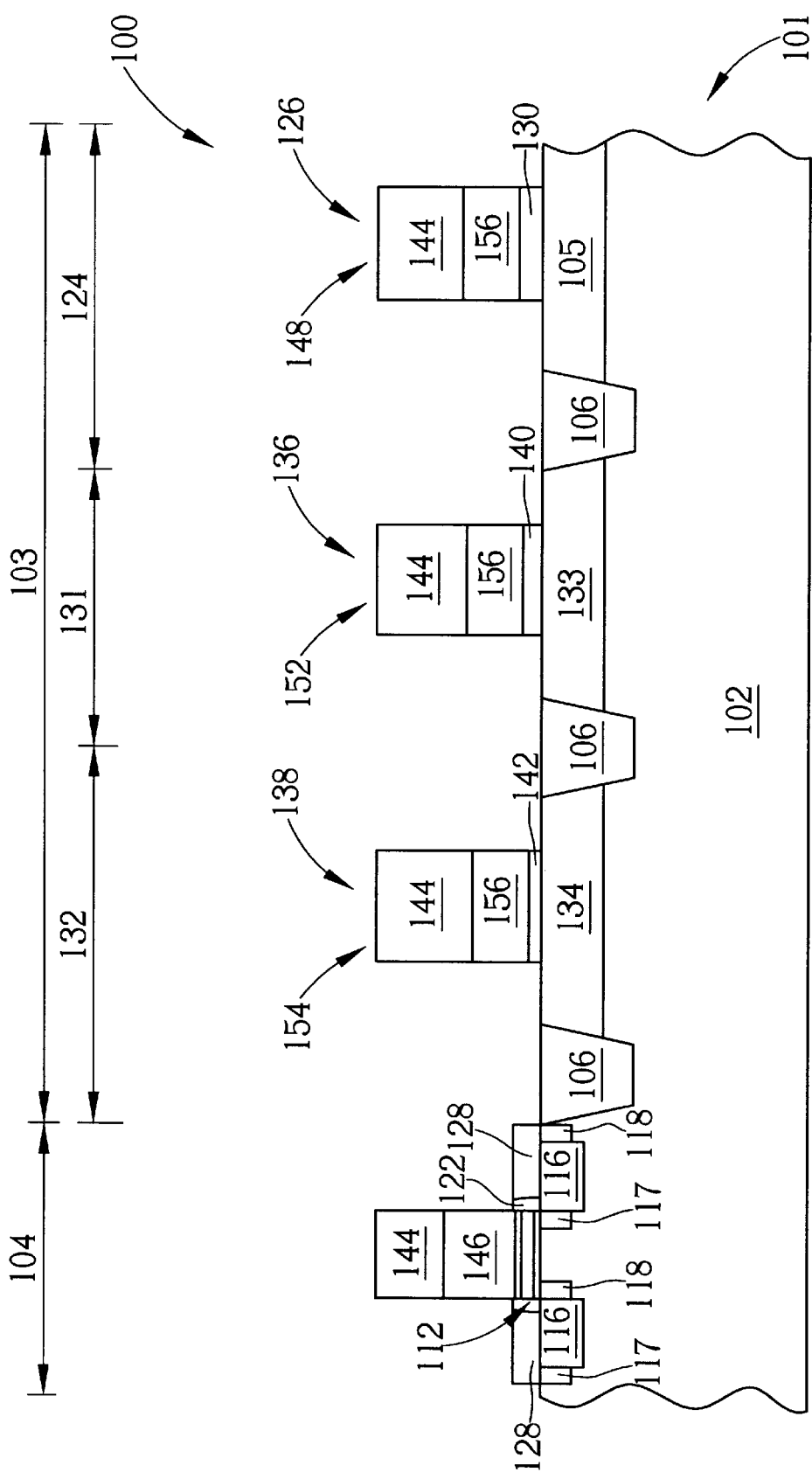

As shown in FIG. 13, a polysilicon layer (not shown) or a polysilicon layer comprising a polysilicide layer is deposited on top of the surfaces of the ONO dielectric layer 112 and each gate oxide layer. Then, a second photolithography process is performed in order to form a second photoresist layer 144 on the surface of the polysilicon layer in order to define the sites of word lines 146 and the gates 156 of the first, the second and the third periphery transistors 148, 152, 154. Thereafter, a dry etching process removes regions of the polysilicon layer not covered by the second photoresist layer 144 in order to simultaneously form the word lines 146 and the gates 156 of the first, the second and the third periphery transistors 148, 152, 154 and the gate oxide layer. Finally, the second photoresist layer 144 is removed.

Figure 14:
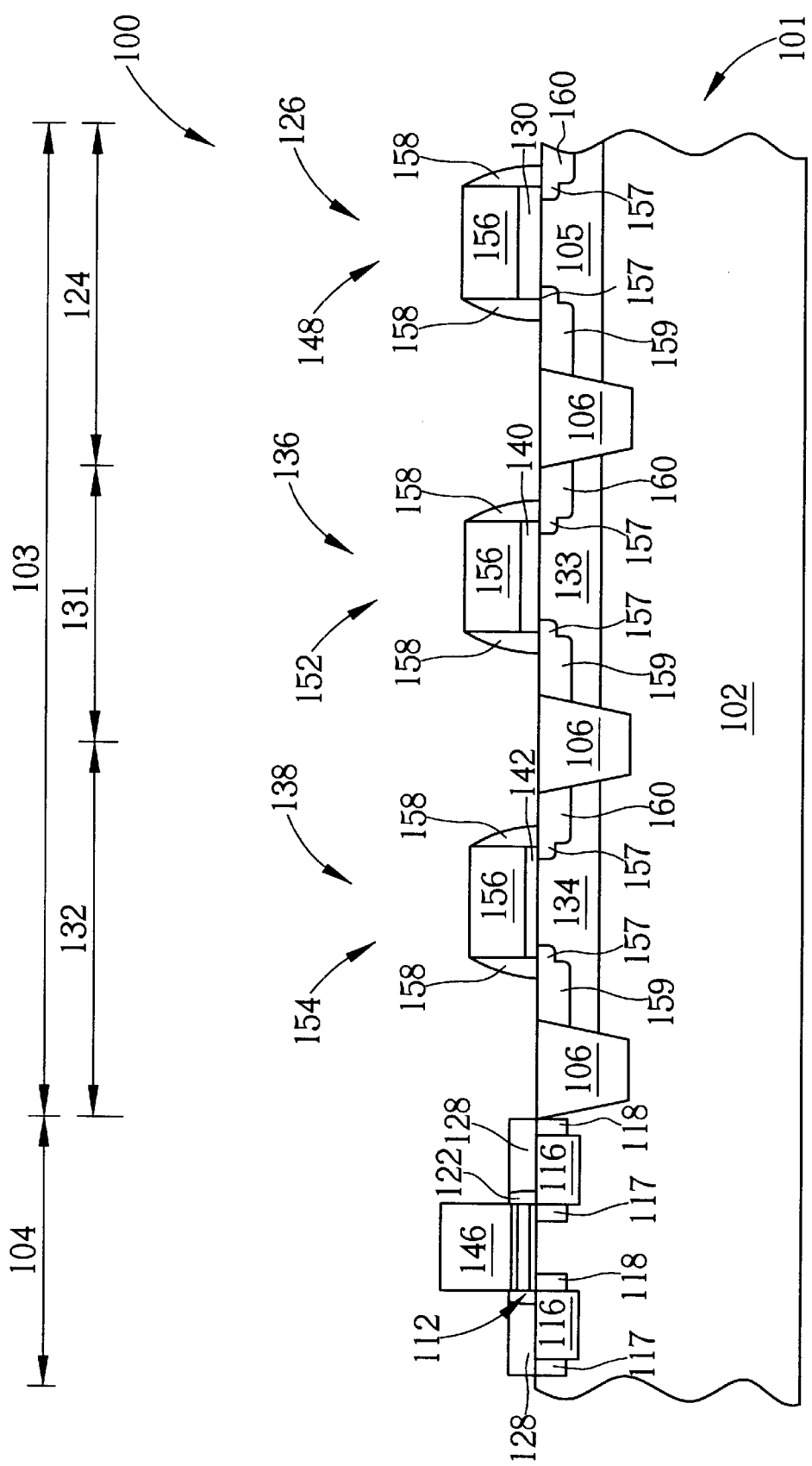

As shown in FIG. 14, some process steps are performed to complete the unfinished process steps for the first, the second and the third periphery transistors 148, 152, 154 in the periphery area 103 on the embedded memory chip, such as formation of the lightly doped drain (LDD) 157, the spacer 158 and the source/drain(S/D) 159, 160.

The method of forming the embedded memory chip in the present invention is to utilize a protective cap layer and a spacer to protect the ONO dielectric layer in the memory device. Even though the wafer needs to be treated with repeated cleaning and etching processes under the premise of forming various periphery devices, the memory structure is still kept integrated. Therefore, problems of electrical performance being out of spec and infeasibility of broad distribution for memory devices is effectively avoided, and reliability of the memory device is improved. Furthermore, the present invention forms gate oxide layers of various thicknesses in the periphery area, which not only can be applied on periphery transistors with different voltage, but can also be applied on different kinds of periphery transistors (such as NMOS and PMOS). Furthermore, the gate oxide layers can be applied on nitride read only memory (NROM) with different threshold voltages or other non-volatile memory. This increases the possibility of embedding various devices, and enlarges the application range of a single chip. Also, the cost for nitride read only memory is cheaper than flash ROM memory, and NROM has a simpler manufacturing process.

Compared to the prior art method of forming nitride read only memory and a periphery transistor on a single chip, the present invention utilizes a protective cap layer and a spacer to protect the ONO dielectric layer in the memory device. Even though the wafer needs to be treated with repeated cleaning and etching processes, the memory structure is still kept integrated. Therefore, problems of electrical performance being out of spec and infeasibility of broad distribution for memory devices can be avoided, and reliability of the memory device is improved. Furthermore, the present invention forms gate oxide layers of various thicknesses in the periphery area, which can be applied on many different devices. This increases the possibility of embedding various devices, and enlarges the application range of a single chip. Compared to the prior art method of forming a flash ROM comprising read only memory, the present invention reduces cost greatly, and simplifies the manufacturing process.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming an embedded memory integrated with nitride read only memory (NROM), the method comprising:

providing a semiconductor substrate having a memory area and a periphery area, the periphery area having a first device area, a second device area and a third device area;

forming a plurality of insulators on the surface of the semiconductor substrate for isolating devices;

forming an ONO layer and a cap protective layer on the surface of the semiconductor substrate;

forming a first photoresist layer over the ONO layer and the cap protective layer, and performing a first photolithography process to define a plurality of bit lines;

performing a first etching process to remove the cap protective layer and the ONO layer not covered by the first photoresist layer;

performing a first ion implantation process to form each bit line in the semiconductor substrate in the memory area;

removing the first photoresist layer;

forming a spacer at either side of the cap protective layer and the ONO layer in the memory area;

performing a second etching process to remove the cap protective layer and the ONO layer in the first device area;

performing a second ion implantation process to adjust a threshold voltage of a device in the first device area;

performing a first thermal oxidation process to form a buried drain oxide layer atop each of the bit lines, and a gate oxide layer in the first device area;

performing a third etching process to remove the cap protective layer and the ONO layer in the second device area and the third device area;

performing a second thermal oxidation process to form a second gate oxide layer in the second device area and in the third device area;

removing the cap protective layer in the memory area;

performing a fourth etching process to remove the second gate oxide layer in the third device area; and performing a third thermal oxidation process to form a third gate oxide layer in the third device area.

2. The method of claim 1 wherein the semiconductor substrate is a silicon substrate.

3. The method of claim 1 wherein the ONO layer is composed of a bottom oxide layer, a silicon nitride layer and a top oxide layer.

4. The method of claim 3 wherein the bottom oxide layer is formed by utilizing a low temperature oxidation process with a temperature ranging from 750° C. to 1000° C., and a thickness ranging from 50 angstroms(Å) to 150 Å.

5. The method of claim 3 wherein the silicon nitride layer is formed by utilizing a low pressure vapor deposition (LPCVD) process, for use as a charge chapping layer of the NROM, and has a thickness ranging from 100 angstroms(Å) to 300 Å.

6. The method of claim 3 wherein the top oxide layer is formed by utilizing a wet oxidation process with a thickness ranging from 50 angstroms(Å) to 200 Å.

7. The method of claim 1 further comprising a third ion implantation process for forming a plurality of wells in the periphery area.

8. The method of claim 1 further comprising a first angled ion implantation process and a second angled ion implantation process to form a P-type pocket doping area at two sides of each bit line.

9. The method of claim 8 wherein the first angled ion implantation process and the second angled ion implantation process are performed prior to the first ion implantation process.

10. The method of claim 8 wherein the first angled ion implantation process and the second angled ion implantation process are performed after the first ion implantation process.

11. The method of claim 1 wherein after completing the third thermal oxidation process the method further comprises:

forming a polysilicon layer and a second photoresist layer on the surface of the semiconductor substrate, defining a plurality of word lines in the second photoresist layer in the memory area and a plurality of gates of each periphery transistor in the second photoresist layer in the periphery area by utilizing a second photolithography process;

performing a fifth etching process to remove the polysilicon layer not covered by the second photoresist layer, and simultaneously forming each word line in the memory area and each gate of each periphery transistor in the periphery area; and removing the second photoresist layer.

* * * * *